United States Patent
Tatsumi et al.

(10) Patent No.: US 12,215,438 B2
(45) Date of Patent: Feb. 4, 2025

(54) SINGLE-CRYSTAL DIAMOND AND METHOD OF MANUFACTURING THE SAME

(71) Applicants: Sumitomo Electric Industries, Ltd., Osaka (JP); SUMITOMO ELECTRIC HARDMETAL CORP., Itami (JP)

(72) Inventors: Natsuo Tatsumi, Osaka (JP); Yoshiki Nishibayashi, Osaka (JP); Takuya Nohara, Itami (JP); Akihiko Ueda, Itami (JP); Yutaka Kobayashi, Itami (JP)

(73) Assignees: Sumitomo Electric Industries, Ltd., Osaka (JP); SUMITOMO ELECTRIC HARDMETAL CORP., Itami (JP)

( * ) Notice: Subject to any disclaimer, the term of this patent is extended or adjusted under 35 U.S.C. 154(b) by 1363 days.

(21) Appl. No.: 16/647,499

(22) PCT Filed: Sep. 14, 2018

(86) PCT No.: PCT/JP2018/034168
§ 371 (c)(1),
(2) Date: Mar. 14, 2020

(87) PCT Pub. No.: WO2019/059123
PCT Pub. Date: Mar. 28, 2019

(65) Prior Publication Data
US 2020/0216974 A1    Jul. 9, 2020

(30) Foreign Application Priority Data
Sep. 19, 2017   (JP) .................................. 2017-179057

(51) Int. Cl.
*C30B 29/04*   (2006.01)
*C23C 16/27*   (2006.01)
*C30B 25/14*   (2006.01)

(52) U.S. Cl.
CPC .............. *C30B 29/04* (2013.01); *C23C 16/27* (2013.01); *C30B 25/14* (2013.01)

(58) Field of Classification Search
None
See application file for complete search history.

(56) References Cited

U.S. PATENT DOCUMENTS

| | | | |
|---|---|---|---|
| 5,387,310 A | 2/1995 | Shiomi et al. | |
| 7,160,617 B2 * | 1/2007 | Scarsbrook | C30B 29/04 427/334 |

(Continued)

FOREIGN PATENT DOCUMENTS

| | | |
|---|---|---|
| JP | S59-137396 A | 8/1984 |
| JP | H02-233591 A | 9/1990 |

(Continued)

OTHER PUBLICATIONS

V. Mortet et al., "Properties of boron-doped epitaxial diamond layers grown on (110) oriented single crystal substrates," Diamond & Related Materials, 2015, vol. 53, pp. 29-34.

*Primary Examiner* — Guinever S Gregorio
(74) *Attorney, Agent, or Firm* — Faegre Drinker Biddle & Reath LLP

(57) ABSTRACT

A single-crystal diamond includes n types of regions different in total concentration of an impurity, the n types of regions being observed in an observed surface being in parallel to a (110) face. Each of the n types of regions has an area not smaller than 0.1 μm². At least one of a first line, a second line, and a third line on the observed surface crosses a boundary between the n types of regions at least four times. The first line, the second line, and the third line are in parallel to a <−110> direction and have a length of 1 mm. A midpoint of the first line corresponds to the center of gravity of the observed surface. The second line and the third (Continued)

line are distant from the first line by 300 μm in a <001> direction and a <00−1> direction, respectively.

11 Claims, 9 Drawing Sheets

(56) References Cited

U.S. PATENT DOCUMENTS

2007/0092647 A1* 4/2007 Scarsbrook ............. C30B 29/04
                                                    427/249.5
2018/0236515 A1* 8/2018 Nishibayashi .......... C30B 31/22

FOREIGN PATENT DOCUMENTS

| | | |
|---|---|---|
| JP | H07-277890 A | 10/1995 |
| JP | 2007-210815 A | 8/2007 |
| JP | 2014-500226 A | 1/2014 |
| WO | WO-2012/084750 A1 | 6/2012 |
| WO | WO-2016/074965 A1 | 5/2016 |
| WO | WO-2017/069051 A1 | 4/2017 |

* cited by examiner

SINGLE-CRYSTAL DIAMOND AND METHOD OF MANUFACTURING THE SAME

TECHNICAL FIELD

The present disclosure relates to a single-crystal diamond and a method of manufacturing the same. The present application claims priority to Japanese Patent Application No. 2017-179057 filed on Sep. 19, 2017, the entire contents of which are incorporated herein by reference.

BACKGROUND ART

A technique for growing a single-crystal diamond on a (110) face of a seed substrate has conventionally been developed (Japanese Patent Laying-Open No. 2007-210815 (PTL 1) and Japanese National Patent Publication No. 2014-500226 (PTL 2)).

CITATION LIST

Patent Literature

PTL 1: Japanese Patent Laying-Open No. 2007-210815
PTL 2: Japanese National Patent Publication No. 2014-500226

Non Patent Literature

NPL 1: V. Mortet et al., "Properties of boron-doped epitaxial diamond layers grown on (110) oriented single crystal substrates," Diamond & Related Materials, 2015, Vol. 53, pp. 29-34

SUMMARY OF INVENTION

A single-crystal diamond according to one manner of the present disclosure includes n types of regions different in total concentration of an impurity where n is 2 or 3, the n types of regions being observed in an observed surface being in parallel to a (110) face and having surface roughness Ra not greater than 5 µm, the observed surface being obtained by polishing a surface of the single-crystal diamond. Each of the n types of regions has an area not smaller than 0.1 µm$^2$. At least one of a first line, a second line, and a third line on the observed surface crosses a boundary between the n types of regions at least four times. The first line, the second line, and the third line are line segments that are in parallel to a <−110> direction and have a length of 1 mm. A midpoint of the first line corresponds to the center of gravity of the observed surface. A midpoint of the second line corresponds to a point distant from the center of gravity by 300 µm in a <001> direction. A midpoint of the third line corresponds to a point distant from the center of gravity by 300 µm in a <00−1> direction.

A method of manufacturing a single-crystal diamond according to one manner of the present disclosure includes preparing a seed substrate having a main surface angled off relative to a (110) face by at least 0° and at most 7°, growing a single-crystal diamond layer on the main surface by chemical vapor deposition using hydrogen gas, methane gas, and impurity gas, and separating the seed substrate and the single-crystal diamond layer from each other. In the growing a single-crystal diamond layer, a concentration of methane gas with respect to hydrogen gas is not lower than 1 mol % and not higher than 20 mol % and a concentration of impurity gas with respect to methane gas is not lower than 1 mol ppm and not higher than 50 mol %.

DETAILED DESCRIPTION

Figure 1:
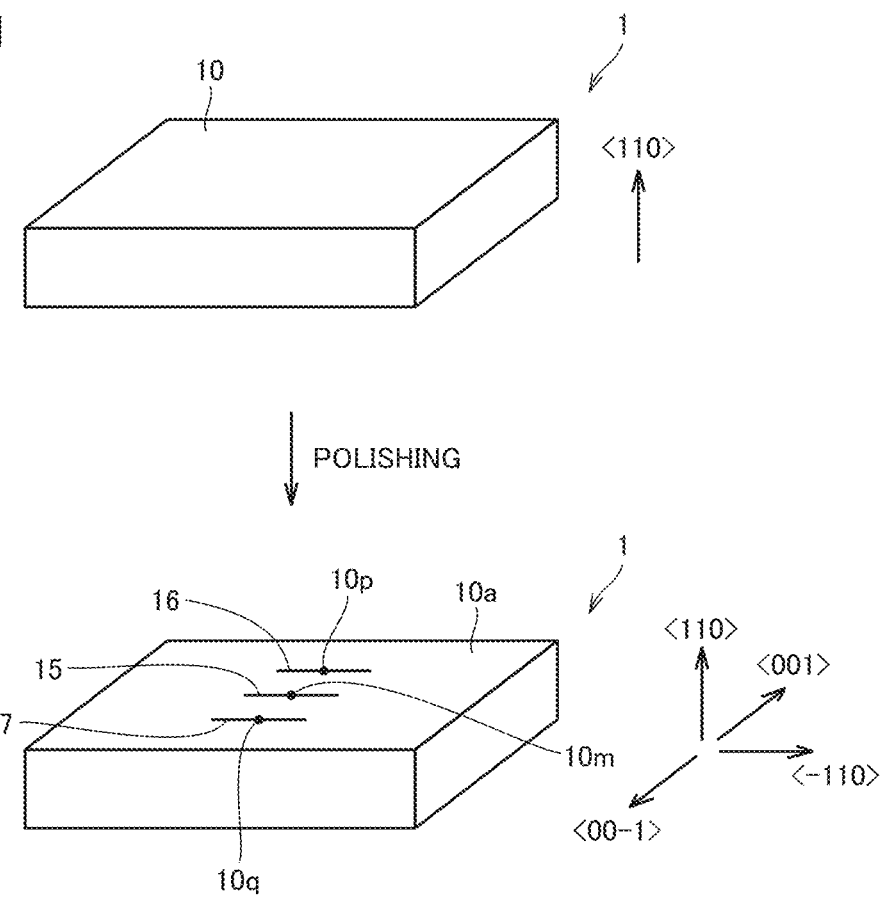
FIG. 1 is a perspective view showing an exemplary single-crystal diamond according to the present embodiment.

Problem to be Solved by the Present Disclosure

A diamond has excellent characteristics such as high thermal conductivity, high carrier mobility, high breakdown electric field, and low induction loss, and it has widely been used for a cutting tool and a wear resistant tool because of its particularly unparalleled high hardness and high wear resistance. A natural single-crystal diamond or a single-crystal diamond obtained by a high-pressure high-temperature synthesis method has conventionally widely been used. Recently, however, a technique for synthesizing a single-crystal diamond that is large in thickness and can be free-standing also with chemical vapor deposition (CVD) has been developed.

With CVD, a single-crystal diamond is readily grown on a (100) face. Therefore, in general, a technique for growing a single-crystal diamond on the (100) face of a seed substrate with CVD has been known. In a cutting tool, however, a (110) face is often used as a rake face. Therefore, when a single-crystal diamond grown on the (100) face of the seed substrate is used for a cutting tool, time and efforts for cutting the (110) face from the single-crystal diamond are required. Then, development of a technique for growing a single-crystal diamond on the (110) face of the seed substrate has progressed (PTLs 1 and 2).

According to the techniques described in PTLs 1 and 2, an amount of impurity contained in a single-crystal diamond is small and a single-crystal diamond high in hardness is obtained, whereas cleavage is likely and chipping resistance is poor.

In view of the aspects above, an object of the present disclosure is to provide a single-crystal diamond excellent in chipping resistance and a method of manufacturing the same.

Advantageous Effect of the Present Disclosure

According to the above, a single-crystal diamond excellent in chipping resistance and a method of manufacturing the same can be provided.

Description of Embodiments of the Present Disclosure

Embodiments of the present disclosure are initially listed and described. An expression in a format "A to B" herein means the upper limit and the lower limit of a range (that is, not smaller than A and not greater than B). When a unit is not given for A but a unit is given only for B, A and B are common in unit.

A single-crystal diamond as homogenous as possible has conventionally been sought for as a single-crystal diamond to be applied to a cutting tool, a polishing tool, an electronic component, an optical component, a semiconductor material, and a heat radiation component. In a single-crystal diamond having a (110) face as its main surface, however, a (111) face along which cleavage is likely extends in a direction intersecting with the main surface. Therefore, when force is applied to the main surface, even the homogenous single-crystal diamond tends to be chipped. The present inventors have found for the first time that chipping resistance is improved by intentionally making a single-crystal diamond inhomogeneous and invented the embodiment of the present disclosure.

[1] A single-crystal diamond according to the present disclosure includes n types of regions different in total concentration of an impurity where n is 2 or 3, the n types of regions being observed in an observed surface being in parallel to a (110) face and having surface roughness Ra not greater than 5 µm, the observed surface being obtained by polishing a surface of the single-crystal diamond. Each of the n types of regions has an area not smaller than 0.1 µm². At least one of a first line, a second line, and a third line on the observed surface crosses a boundary between the n types of regions at least four times. The first line, the second line, and the third line are line segments that are in parallel to a <−110> direction and have a length of 1 mm. A midpoint of the first line corresponds to the center of gravity of the observed surface. A midpoint of the second line corresponds to a point distant from the center of gravity by 300 µm in a <001> direction. A midpoint of the third line corresponds to a point distant from the center of gravity by 300 µm in a <00−1> direction.

According to the feature above, in the observed surface in parallel to the (110) face of the single-crystal diamond, n (n being 2 or 3) types of regions different in total concentration of an impurity are present as being mixed. In general, as a concentration of an impurity is higher, a hardness is lower. Therefore, presence of n types of regions different in total concentration of an impurity as being mixed means presence of n types of regions different in hardness as being mixed. Presence of n types of regions different in hardness as being mixed can relax stress at the time of application of stress to the single-crystal diamond and cleavage of the single-crystal diamond is less likely. A single-crystal diamond excellent in chipping resistance can be realized as set forth above.

[2] The total concentration of the impurity in one of two types of regions selected from the n types of regions is not lower than 30% of the total concentration of the impurity in the other of the two types of regions. Thus, the n types of regions can readily be distinguished from each other.

[3] In the single-crystal diamond, in a cross-section obtained by cutting the single-crystal diamond along a plane including the center of gravity of the observed surface and being in parallel to a (−110) face, the n types of regions different in total concentration of the impurity are observed. An angle formed between a boundary between the n types of regions observed in the cross-section and a <110> direction is not smaller than 0° and not greater than 7°.

Cleavage of a single-crystal diamond has been known to be likely along the (111) face. According to the feature above, in the cross-section, the boundary between the n types of regions different in total concentration of the impurity intersects with the (111) face. Therefore, even though a small crack along the (111) face is produced in the single-crystal diamond, development of the crack is stopped at the boundary between the n types of regions different in total concentration of the impurity and cleavage of a single-crystal diamond 1 is less likely. A single-crystal diamond further excellent in chipping resistance can thus be realized.

[4] The impurity includes at least one selected from the group consisting of B, P, Al, and S. A single-crystal diamond in which n types of regions different in total concentration of the impurity are observed in the observed surface can thus readily be manufactured.

[5] The impurity further includes N. A single-crystal diamond in which n types of regions different in total concentration of the impurity are observed in the observed surface can thus readily be manufactured.

[6] The total concentration of the impurity contained in the single-crystal diamond is not lower than 3 mol ppm. Thus, when stress is applied to the single-crystal diamond, stress is readily absorbed and occurrence of cleavage of the single-crystal diamond can further be suppressed.

[7] The single-crystal diamond includes a dislocation observed in an X-ray topographic image. An angle formed between a direction of the dislocation and a <110> direction is not smaller than 0° and not greater than 20°. Thus, even though a small crack along the (111) face is produced in the single-crystal diamond, development of the crack is stopped by the dislocation and cleavage of the single-crystal diamond is less likely.

[8] The single-crystal diamond has a Knoop hardness not higher than 100 GPa, the Knoop hardness being measured in the observed surface such that a longer diagonal of a Knoop indentation is in parallel to the <001> direction. Strain is thus less likely to be accumulated in the single-crystal diamond. Consequently, the single-crystal diamond is excellent in chipping resistance and suitable for a cutting tool.

[9] In a Raman scattering spectrum of the single-crystal diamond measured by Raman spectroscopy at an excitation wavelength of 512 nm, absolute intensity of a peak of a Raman shift from 850 to 950 $cm^{-1}$ is higher than 10% of absolute intensity of a peak of a Raman shift from 1310 to 1340 $cm^{-1}$. Thus, the single-crystal diamond sufficiently contains B as an impurity and is excellent in chipping resistance and wear resistance.

[10] The single-crystal diamond includes a first layer having resistivity at room temperature not lower than $10^6$ Ωcm and a second layer having resistivity at room temperature lower than $10^6$ Ωcm. An interface between the first layer and the second layer is in parallel to the (110) face. The observed surface is obtained by polishing the second layer. The single-crystal diamond according to the feature above is obtained by growing the first layer on the main surface which is the (110) face of a seed substrate with chemical vapor deposition and thereafter growing the second layer on the first layer. A conductive layer is formed by implanting carbon ions into the seed substrate in advance. When electrolytic etching is performed after growth of the first layer, electric field tends to be concentrated in the conductive layer because the first layer has resistivity not lower than $10^6$ Ωcm. Therefore, the first layer and the seed substrate can readily be separated from each other.

[11] In the single-crystal diamond, the impurity includes at least one selected from the group consisting of B, P, Al, and S and the total concentration of the impurity contained in the single-crystal diamond is not lower than 3 mol ppm. The single-crystal diamond has a Knoop hardness not higher than 100 GPa, the Knoop hardness being measured in the observed surface such that a longer diagonal of a Knoop indentation is in parallel to the <001> direction. Thus, when stress is applied to the single-crystal diamond, stress is readily absorbed and occurrence of cleavage of the single-crystal diamond can further be suppressed. Furthermore, strain is less likely to be accumulated in the single-crystal diamond. Consequently, the single-crystal diamond is excellent in chipping resistance and suitable for a cutting tool.

[12] A method of manufacturing a single-crystal diamond according to the present disclosure includes preparing a seed substrate having a main surface angled off relative to a (110) face by at least 0° and at most 7°, growing a single-crystal diamond layer on the main surface by chemical vapor deposition using hydrogen gas, methane gas, and impurity gas, and separating the seed substrate and the single-crystal diamond layer from each other. In the growing a single-crystal diamond layer, a concentration of methane gas with respect to hydrogen gas is not lower than 1 mol % and not higher than 20 mol % and a concentration of impurity gas with respect to methane gas is not lower than 1 mol ppm and not higher than 50 mol %.

According to the manufacturing method having the feature above, a region where the (100) face is grown and a region where the (111) face is grown are produced on the main surface of the seed substrate as being mixed. A region where a (113) face is grown may also be produced as being mixed in these two regions. These regions are different from one another in concentration of an impurity taken thereinto. Thus, in the observed surface of the single-crystal diamond obtained by the manufacturing method having the feature above, n types of regions different in total concentration of the impurity are observed as being mixed. Consequently, a single-crystal diamond excellent in chipping resistance can be manufactured.

[13] Impurity gas contains at least one selected from the group consisting of B, P, Al, and S. The single-crystal diamond in which n types of regions different in total concentration of the impurity are observed in the observed surface is thus readily manufactured.

An embodiment of the present disclosure (which will be denoted as "the present embodiment" below) will be described below. The present embodiment, however, is not limited thereto. The same or corresponding elements in the drawings used for explaining the embodiment below have the same reference characters allotted.

<Structure of Single-Crystal Diamond>

A "single-crystal diamond" in the present disclosure refers to a diamond fixed in crystal orientation and containing substantially no polycrystalline diamond, and it is identified based on the fact that intensity at a diffraction point or a diffraction ring belonging to polycrystal is not higher than 10%, not higher than 1%, or not higher than 0.1% of a most intense diffraction point belonging to the (110) face in X-ray Laue diffraction.

FIG. 1 is a perspective view showing an exemplary single-crystal diamond 1 according to the present embodiment. A surface of single-crystal diamond 1 includes a main surface 10 angled off relative to a (110) face by at least 0° and at most 7°. The "main surface" refers to a surface largest in area among surfaces of single-crystal diamond 1. Though FIG. 1 shows single-crystal diamond 1 in a shape of a parallelepiped, the shape of single-crystal diamond 1 is not particularly restricted.

Single-crystal diamond 1 has a thickness in a <110> direction preferably not smaller than 100 μm, and more preferably not smaller than 300 μm, not smaller than 500 μm, not smaller than 1 mm, not smaller than 2 mm, or not smaller than 5 mm. Single-crystal diamond 1 is thus readily applied to a cutting tool. Though an upper limit value of the thickness in the <110> direction of single-crystal diamond 1 is not particularly limited, the thickness is preferably not greater than 20 mm in consideration of time for growth with CVD.

In an observed surface 10a that is obtained by polishing the surface (main surface 10) of single-crystal diamond 1, is in parallel to the (110) face, and has surface roughness Ra not greater than 5 μm, n types of regions different in total concentration of an impurity where n is 2 or 3 are observed. Surface roughness (arithmetic mean roughness) Ra is measured under JIS B-0601 (2001). A lower limit value of surface roughness Ra is not particularly limited, and the surface should only be polished to such an extent that an image of observed surface 10a which will be described later is not affected by surface irregularities.

A difference in total concentration of an impurity in single-crystal diamond 1 is represented by a difference in any of intensity of photoluminescence (PL), intensity of cathode luminescence (CL), secondary electron intensity detected by an electronic microscope, backscattered electron intensity detected by the electronic microscope, and absorption current intensity detected by the electronic microscope. Therefore, by obtaining a PL image, a CL image, or an electron micrograph of observed surface 10a, n types of regions different in total concentration of an impurity can be observed. The total concentration of the impurity in one of two types of regions selected from the n types of regions is not lower than 30% of the total concentration of the impurity in the other. Single-crystal diamond 1 in which two types of regions different in total concentration of the impurity are observed in the entire observed surface 10a will be described below.

Figure 2:
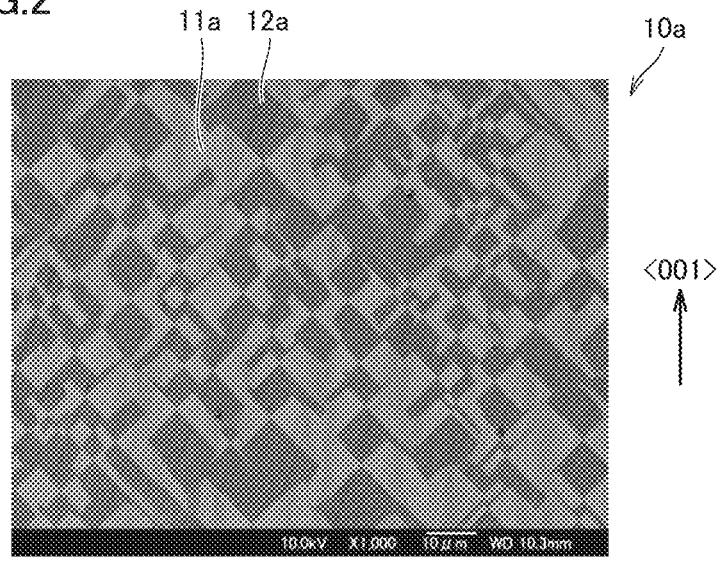
FIG. 2 is a diagram showing a photograph substituted for a drawing obtained by shooting an observed surface of the exemplary single-crystal diamond according to the present embodiment with a scanning electron microscope (SEM).
Figure 3:
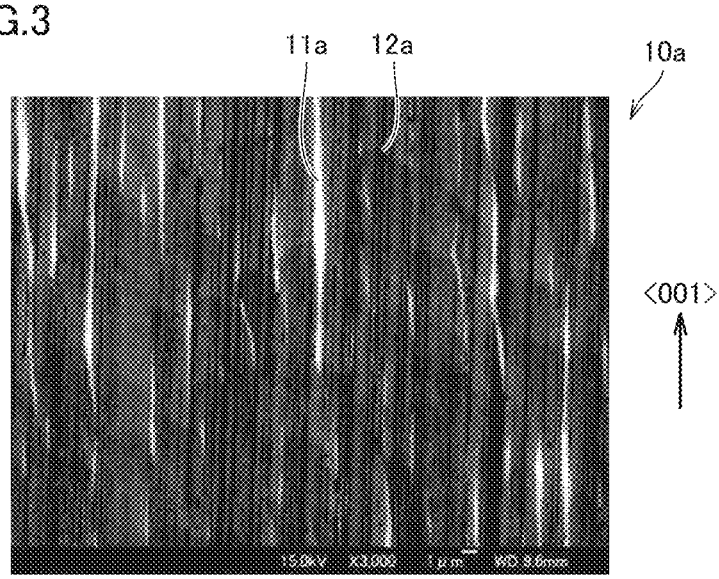
FIG. 3 shows a photograph substituted for a drawing obtained by shooting an observed surface of another exemplary single-crystal diamond according to the present embodiment with the SEM.
Figure 4:
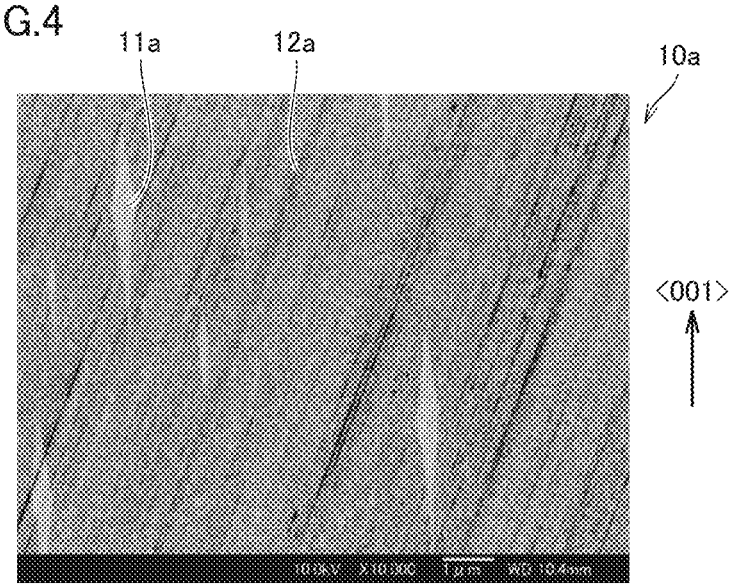
FIG. 4 shows a photograph substituted for a drawing obtained by shooting an observed surface of yet another exemplary single-crystal diamond according to the present embodiment with the SEM.

FIG. 2 is a diagram showing a photograph substituted for a drawing obtained by shooting observed surface 10a of an exemplary single-crystal diamond according to the present embodiment with a scanning electron microscope (SEM). FIG. 3 shows a photograph substituted for a drawing obtained by shooting observed surface 10a of another exemplary single-crystal diamond according to the present embodiment with the SEM. FIG. 4 shows a photograph substituted for a drawing obtained by shooting observed surface 10a of yet another exemplary single-crystal diamond according to the present embodiment with the SEM. FIGS. 2 to 4 each show a secondary electron image.

As shown in FIGS. 2 to 4, in observed surface 10a, a region 11a relatively high in brightness and a region 12a relatively low in brightness are observed. In each of region 11a and region 12a, variation in impurity concentration is within a certain range (lower than 30%). Each of region 11a and region 12a has an area not smaller than 0.1 μm². A region having an area not greater than 0.1 μm² is ignored. Though streaks caused by polishing are observed in FIGS. 3 and 4, these streaks are also ignored. An upper limit value of the area of each of region 11a and region 12a is not particularly limited. For example, as shown in FIGS. 3 and 4, region 12a may occupy most of observed surface 10a.

Region 12a is higher in total concentration of an impurity than region 11a. Region 12a is higher in total concentration of an impurity than region 11a preferably by at least 30%, at least 50%, at least 100%, at least 300%, or at least 1000%. The total concentration of an impurity in each of regions 11a and 12a is measured by focused secondary ion mass spectrometry (SIMS) or characteristic X-ray spectrometry specifically such as magnetic sector SIMS, time of flight (TOF)-SIMS, and scanning electron microscopy (SEM)-wavelength dispersive X-ray spectrometry (WDS).

In observed surface 10a shown in FIG. 2, region 11a and region 12a are approximately equal in area to each other, and regions 11a and regions 12a are distributed like (quadrangular) tiles. As a part of a corner of a tile-like region is coupled to a corner of another tile-like region, regions 11a and regions 12a covering a wide range are formed.

In observed surface 10a shown in FIG. 3, region 12a is larger in area than region 11a and linear regions 11a are distributed in region 12a. Being "linear" includes also a band shape having a ratio of a length to a width (length/width) is two or more. Linear region 11a desirably extends along a <001> direction.

In observed surface 10a shown in FIG. 4, region 12a is larger in area and rhombic regions 11a are distributed in region 12a. Rhombic region 11a has a longer diagonal in parallel to the <001> direction. A ratio between the longer diagonal and the shorter diagonal of rhombic region 11a is from 1 to 100.

Referring back to FIG. 1, at least one of a first line 15, a second line 16, and a third line 17 on observed surface 10a crosses a boundary between two types of regions 11a and 12a different in total concentration of an impurity at least four times. At least one of first line 15, second line 16, and third line 17 crosses the boundary between regions 11a and 12a preferably at least twenty times and more preferably at least one hundred times. Though an upper limit value of the number of times of crossing by first line 15, second line 16, or third line 17 with the boundary between regions 11a and 12a is not particularly limited, the number of times of crossing is desirably not more than two thousand times because chipping resistance is lowered when a region is too small.

First line 15, second line 16, and third line 17 are each a line segment that is in parallel to a <−110> direction and has a length of 1 mm. A midpoint of first line 15 matches with the center of gravity 10m of observed surface 10a. A midpoint of second line 16 corresponds to a point 10p distant from center of gravity 10m of observed surface 10a by 300 μm in a <001> direction. A midpoint of third line 17 corresponds to a point 10q distant from center of gravity 10m of observed surface 10a by 300 μm in a <00−1> direction.

Figure 5:
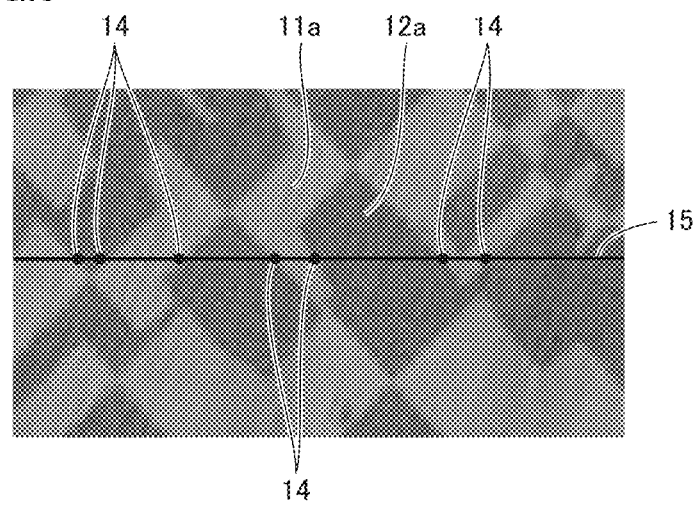
FIG. 5 shows a photograph substituted for a drawing that shows a part of the observed surface shown in FIG. 2 and a first line.
Figure 6:
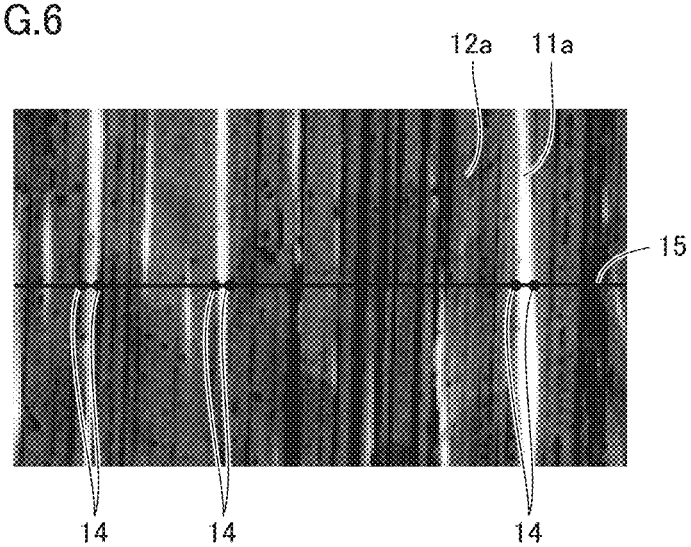
FIG. 6 shows a photograph substituted for a drawing that shows a part of the observed surface shown in FIG. 3 and the first line.
Figure 7:
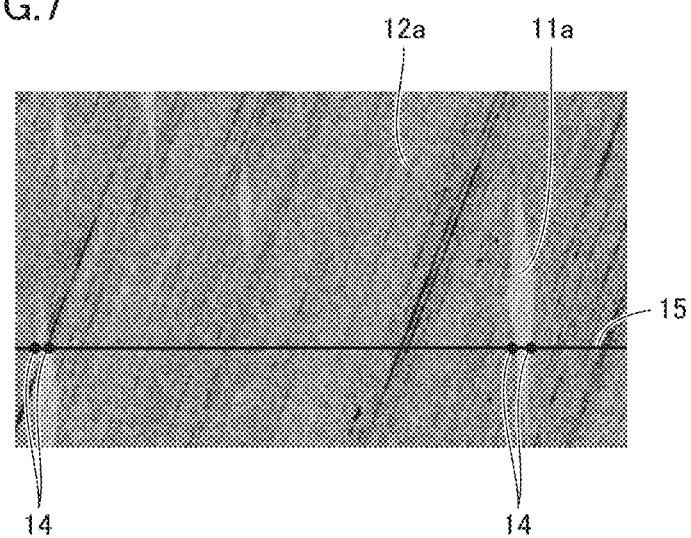
FIG. 7 shows a photograph substituted for a drawing that shows a part of the observed surface shown in FIG. 4 and the first line.

FIG. 5 shows a photograph substituted for a drawing that shows a part of observed surface 10a shown in FIG. 2 and first line 15. FIG. 6 shows a photograph substituted for a drawing that shows a part of observed surface 10a shown in FIG. 3 and first line 15. FIG. 7 shows a photograph substituted for a drawing that shows a part of observed surface 10a shown in FIG. 4 and first line 15. As shown in FIGS. 5 to 7, first line 15 crosses a boundary 14 between region 11a and region 12a at least four times.

Crossing by at least one of first line 15, second line 16, and third line 17 with the boundary between two types of regions different in total concentration of an impurity at least four times means that two types of regions 11a and 12a different in total concentration of an impurity are present as being mixed in observed surface 10a. In general, as a concentration of an impurity is higher in a single-crystal diamond, a hardness thereof is lower. Therefore, region 11a and region 12a are different from each other in hardness. With presence of two types of regions 11a and 12a different in hardness as being mixed, when stress is applied to single-crystal diamond 1, stress can be absorbed and cleavage of single-crystal diamond 1 is less likely. Consequently, single-crystal diamond 1 is excellent in chipping resistance.

In observed surface 10a, a ratio between a total area of regions 11a and a total area of regions 12a is preferably from 3:2 to 2:3. Thus, when stress is applied to single-crystal diamond 1, stress is readily absorbed. The ratio between the area of regions 11a and the area of regions 12a, however, may be modified as appropriate in accordance with a hardness desired for single-crystal diamond 1. For example, when a high hardness is desired, the ratio between the total area of regions 11a and the total area of regions 12a may be set within a range from 3:2 to 5:1 or a range from 5:1 to 999:1. In contrast, when a high hardness is not much desired, the ratio between the total area of regions 11a and the total area of regions 12a may be set within a range from 2:3 to 1:5 or a range from 1:5 to 1:999.

Figure 8:
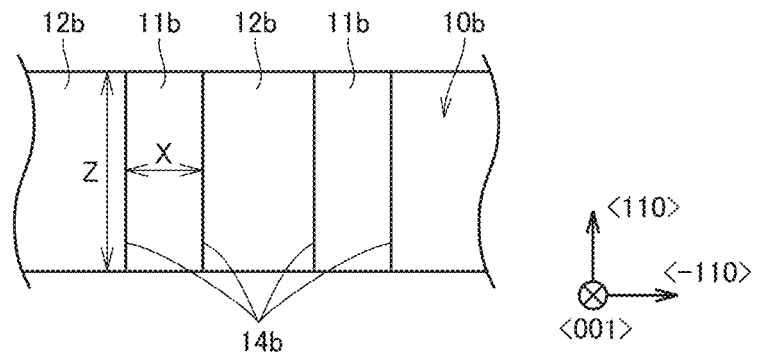
FIG. 8 is a schematic diagram showing a cross-section when the single-crystal diamond is cut along a plane in parallel to a (001) face.
Figure 9:
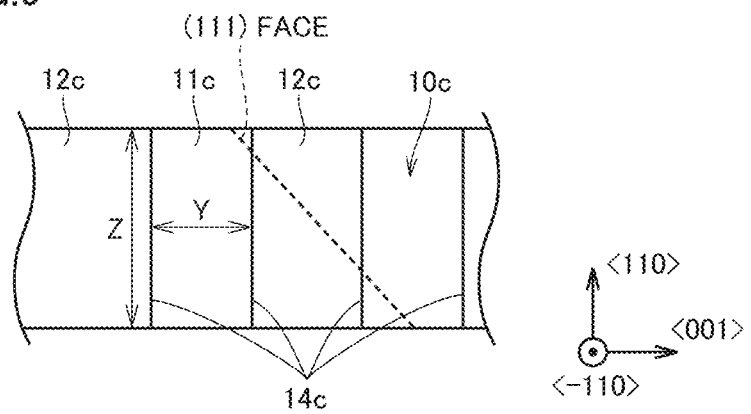
FIG. 9 is a schematic diagram showing a cross-section when the single-crystal diamond is cut along a plane in parallel to a (−110) face.

FIG. 8 is a schematic diagram showing a cross-section 10b when single-crystal diamond 1 is cut along a plane including center of gravity 10m and being in parallel to a (001) face. FIG. 9 is a schematic diagram showing a cross-section 10c when single-crystal diamond 1 is cut along a plane including center of gravity 10m and being in parallel to a (−110) face. Cross-sections 10b and 10c are polished to achieve surface roughness Ra not greater than 5 μm similarly to observed surface 10a. As shown in FIG. 8, in cross-section 10b, two types of regions 11b and 12b different in total concentration of an impurity are observed. In cross-section 10b, an angle formed between a boundary 14b between region 11b and region 12b and the <110> direction is preferably not smaller than 0° and not greater than 7°. Similarly, as shown in FIG. 9, in cross-section 10c, two types of regions 11c and 12c different in total concentration of an impurity are observed. An angle formed between a boundary 14c between two types of regions 11c and 12c observed in cross-section 10c and the <110> direction is preferably not smaller than 0° and not greater than 7°.

Cleavage of a single-crystal diamond has been known to be likely along the (111) face. As shown in FIG. 9, boundary 14c between region 11c and region 12c intersects with the (111) face. Therefore, even though a small crack along the (111) face is produced in single-crystal diamond 1, development of the crack is stopped at boundary 14c and cleavage of single-crystal diamond 1 is less likely.

In cross-section 10c, an aspect ratio Z/Y between a length Y in the <001> direction and a length Z in the <110> direction in at least one of regions 11c and 12c is preferably not smaller than two. The number per unit area of boundaries 14c intersecting with the (111) face is thus greater and occurrence of cleavage of single-crystal diamond 1 can further be suppressed. Similarly, in cross-section 10b, an aspect ratio Z/X between a length X in the <−110> direction and length Z in the <110> direction in at least one of regions 11b and 12b is preferably not smaller than two. Occurrence of cleavage of single-crystal diamond 1 can thus further be suppressed.

<Impurity in Single-Crystal Diamond>

An impurity contained in single-crystal diamond 1 preferably includes at least one selected from the group consisting of B, P, Al, and S, and among these, the single-crystal diamond more preferably contains B. By containing such an element as an impurity, as shown in FIGS. 2 to 4, two types of regions 11a and 12a different in total concentration of an impurity can readily be present as being mixed in observed surface 10a. The impurity contained in single-crystal diamond 1 may include at least one selected from the group consisting of B, P, Al, and S, and may further include another element (for example, N). For example, single-crystal diamond 1 may contain B and N as impurities. A single-crystal diamond in which n (n being 2 or 3) types of regions different in total concentration of an impurity are observed in the observed surface is thus readily manufactured.

A total concentration of a single impurity or a plurality of impurities contained in single-crystal diamond 1 is preferably not lower than 3 mol ppm, and more preferably not lower than 10 mol ppm, not lower than 100 mol ppm, not lower than 1000 mol ppm, or not lower than 10000 mol ppm. Thus, when stress is applied to single-crystal diamond 1, stress is readily absorbed and occurrence of cleavage of single-crystal diamond 1 can further be suppressed. The total concentration of a single impurity or a plurality of impurities contained in single-crystal diamond 1 is preferably not higher than 30000 mol ppm in consideration of a hardness of single-crystal diamond 1 as a whole. A total concentration of an impurity is measured by focused SIMS.

<X-Ray Topographic Image of Single-Crystal Diamond>

As will be described later, single-crystal diamond 1 is obtained by growing with CVD, a single-crystal diamond layer on a main surface angled off relative to the (110) face of a seed substrate by at least 0° and at most 7°. Therefore, a dislocation is observed in an X-ray topographic image of single-crystal diamond 1 and an angle formed between a direction of the dislocation and the <110> direction is not smaller than 0° and not greater than 20°. In other words, in single-crystal diamond 1, the dislocation propagates at an angle not smaller than 0° and not greater than 20° with respect to the <110> direction and is formed across the (111) face along which cleavage is likely. Therefore, even though a small crack along the (111) face is produced in single-crystal diamond 1, development of the crack stops at the dislocation and cleavage of single-crystal diamond 1 is less likely. In single-crystal diamond 1, a dislocation does not propagate perfectly linearly but propagates as meandering at an angle not smaller than 0° and not greater than 20° with respect to the <110> direction as a whole.

<Knoop Hardness of Single-Crystal Diamond>

Figure 10:
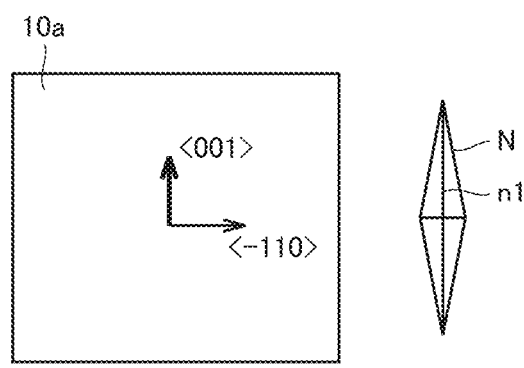
FIG. 10 is a diagram showing a method of measuring a Knoop hardness in the observed surface.

A Knoop hardness is measured with a Knoop indenter that leaves an indentation (Knoop indentation) in a shape of an elongated rhombus. FIG. 10 is a diagram showing a method of measuring a Knoop hardness in observed surface 10a. As shown in FIG. 10, a Knoop hardness is measured in observed surface 10a such that a longer diagonal n1 of a Knoop indentation N is in parallel to the <001> direction. A test load is set to 4.9 N. A type IIa single-crystal diamond obtained by the high-pressure high-temperature synthesis method has a Knoop hardness exceeding 100 GPa. Though the type IIa single-crystal diamond is high in hardness, it is very low in chipping resistance and it is difficult to apply a type IIa single-crystal diamond to a cutting tool. In contrast, single-crystal diamond 1 according to the present embodiment has a Knoop hardness not higher than 100 GPa. Therefore, single-crystal diamond 1 is excellent in chipping resistance and suitable for a cutting tool. A Knoop hardness is preferably not lower than 70 GPa. Cutting performance as a cutting tool can thus be maintained.

<Raman Scattering Spectrum>

When single-crystal diamond 1 contains B as an impurity, in a Raman scattering spectrum measured by Raman spectroscopy at an excitation wavelength of 512 nm, absolute intensity of a peak of a Raman shift from 850 to 950 $cm^{-1}$ is preferably higher than 10% of absolute intensity of a peak of a Raman shift from 1310 to 1340 $cm^{-1}$.

It has been known that, in a Raman scattering spectrum, a peak of a diamond is observed in a range from 1310 to 1340 $cm^{-1}$ around a Raman shift of 1333 $cm^{-1}$. A broad peak specific to a boron (B)-doped diamond is observed in a Raman shift from 850 to 950 $cm^{-1}$. With absolute intensity of the peak of the Raman shift from 850 to 950 $cm^{-1}$ being higher than 10% of absolute intensity of the peak of the Raman shift from 1310 to 1340 $cm^{-1}$, single-crystal diamond 1 sufficiently contains B as an impurity and is excellent in chipping resistance and wear resistance. In consideration of a hardness of single-crystal diamond 1 as a whole, absolute intensity of the peak of the Raman shift from 850 to 950 $cm^{-1}$ is preferably not higher than 300% of absolute intensity of the peak of the Raman shift from 1310 to 1340 $cm^{-1}$.

Absolute intensity of the peak of the Raman shift from 850 to 950 $cm^{-1}$ and the peak of the Raman shift from 1310 to 1340 $cm^{-1}$ is measured after background processing of the Raman scattering spectrum. The background processing is performed such that background of the peak of the Raman shift from 1310 to 1340 $cm^{-1}$ is 0.

<Method of Manufacturing Single-Crystal Diamond>

Figure 11A:
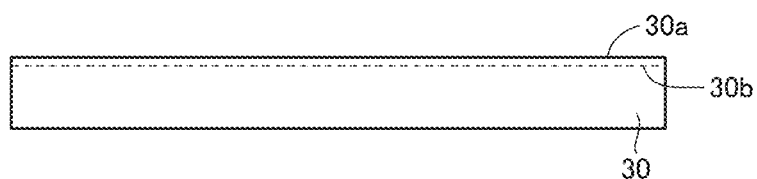
FIG. 11A is a diagram showing a seed substrate preparation step in a method of manufacturing a single-crystal diamond according to the present embodiment.
Figure 11B:
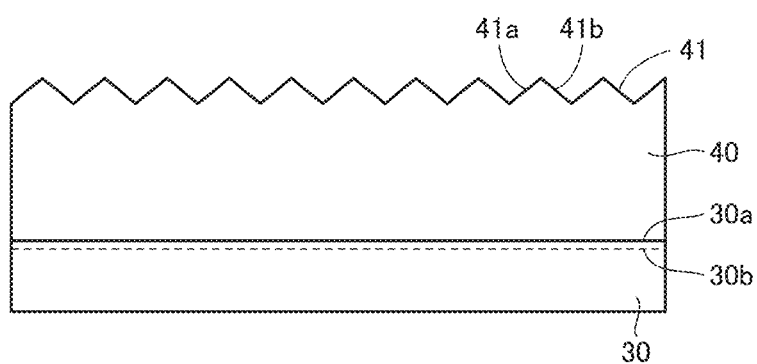
FIG. 11B is a diagram showing a growth step in the method of manufacturing a single-crystal diamond according to the present embodiment.
Figure 11C:
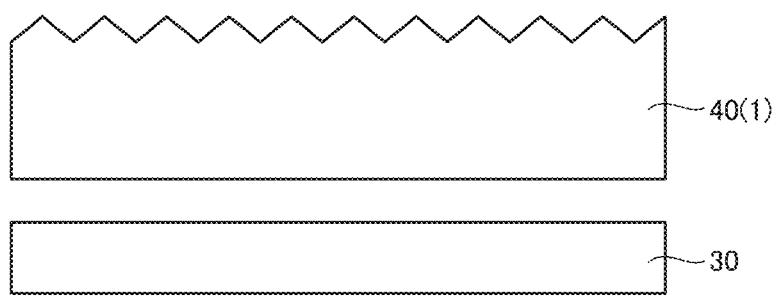
FIG. 11C is a diagram showing a separation step in the method of manufacturing a single-crystal diamond according to the present embodiment.

A method of manufacturing single-crystal diamond 1 will now be described with reference to FIGS. 11A to 11C. The method of manufacturing single-crystal diamond 1 includes a <<seed substrate preparation step>>, a <<growth step>>, and a <<separation step>>. FIG. 11A is a diagram showing the seed substrate preparation step in the method of manufacturing single-crystal diamond 1 according to the present embodiment. FIG. 11B is a diagram showing the growth step in the method of manufacturing single-crystal diamond 1 according to the present embodiment. FIG. 11C is a diagram showing the separation step in the method of manufacturing single-crystal diamond 1 according to the present embodiment.

<<Seed Substrate Preparation Step>>

As shown in FIG. 11A, the seed substrate preparation step is a step of preparing a seed substrate 30 including a main surface 30a angled off relative to the (110) face by at least 0° and at most 7°. Seed substrate 30 may be composed of a single-crystal diamond synthesized by the high-pressure high-temperature synthesis method or a single-crystal diamond epitaxially grown with CVD. Seed substrate 30 has a defect density preferably not higher than $10^5/cm^2$. A lower limit of the defect density of seed substrate 30 is not particularly limited and the defect density is ideally 0.

Carbon ions are implanted into main surface 30a of seed substrate 30 at a dose from $1 \times 10^{15}$ to $1 \times 10^{19}/cm^2$ with energy from 300 keV to 3 MeV to thereby form a conductive layer 30b.

A metal film composed, for example, of W, Nb, Ta, Fe, Ni, or Co may be formed on a side surface of seed substrate 30. Growth of a single-crystal diamond on the side surface of seed substrate 30 in the subsequent growth step can thus be suppressed.

<<Growth Step>>

The growth step is then performed. As shown in FIG. 11B, the growth step is a step of growing a single-crystal diamond layer 40 on main surface 30a of seed substrate 30 with chemical vapor deposition (CVD) using hydrogen gas, methane gas, and impurity gas.

Impurity gas contains at least one selected from the group consisting of B, P, Al, and S. Specifically, at least one of gas containing B (diborane ($B_2H_6$) or trimethylboron (($CH_3$)$_3$B)), gas containing P (phosphine ($PH_3$) or trimethylphosphine (P($CH_3$)$_3$)), gas containing S (hydrogen sulfide ($H_2S$)), and gas containing Al (trimethylaluminum (($CH_3$)$_3$Al) can be employed as impurity gas. Impurity gas may include nitrogen gas ($N_2$) in addition to any gas above.

<<Separation Step>>

The separation step is finally performed. As shown in FIG. 11C, the separation step is a step of separating seed substrate 30 and single-crystal diamond layer 40 from each other. Single-crystal diamond 1 is made up of single-crystal diamond layer 40 separated from seed substrate 30. Since conductive layer 30b is formed in the seed substrate preparation step, seed substrate 30 and single-crystal diamond layer 40 can readily be separated from each other by electrolytic etching in aqua pura.

<<Concentration of Methane Gas and Impurity Gas>>

In the present embodiment, in the growth step, a concentration of methane gas with respect to hydrogen gas is not lower than 1 mol % and not higher than 20 mol % and a concentration of impurity gas with respect to methane gas is not lower than 1 mol ppm and not higher than 50 mol %. When gas containing B is employed as impurity gas, a concentration of impurity gas with respect to methane gas is preferably not lower than 100 mol ppm and not higher than 50 mol %. By thus setting a concentration of methane gas and impurity gas to be higher than in a conventional example, a growth surface 41 of single-crystal diamond layer 40 has characteristics as shown in (α), (β), and (γ) below.

(α) Growth surface 41 is a surface that extends in parallel to main surface 30a angled off relative to the (110) face by at least 0° and at most 7° and has a finely projecting and recessed structure. The finely projecting and recessed structure of growth surface 41 is formed by repetition of small faces 41a as the (100) face and small surfaces 41b as the (111) face that are inclined with respect to main surface 30a along a direction in parallel to main surface 30a.

(β) A single-crystal diamond is epitaxially grown on each of small faces 41a and 41b along a direction of normal to main surface 30a.

(γ) Small face 41a as the (100) face and small face 41b as the (111) face are different from each other in how readily an impurity element is taken thereinto. For example, B is more likely to be taken into small face 41a but less likely to be taken into small face 41b.

According to the characteristics in (α) and (γ), as shown in FIGS. 2 to 4, regions 11a and 12a different in total concentration of an impurity are observed in observed surface 10a. In an example in which B is employed as an impurity, region 11a relatively low in total concentration of the impurity corresponds to a region where small face 41b has been grown and region 12a relatively high in total concentration of the impurity corresponds to a region where small face 41a has been grown.

According to the characteristics in (β) and (γ), as shown in FIG. 8, regions 11b and 12b different in total concentration of the impurity are observed in cross-section 10b, and an angle formed between boundary 14b between regions 11b and 12b and the <110> direction is not smaller than 0° and not greater than 7°. Similarly, as shown in FIG. 9, regions 11c and 12c different in total concentration of the impurity are observed in cross-section 10c, and an angle formed between boundary 14c between regions 11c and 12c and the <110> direction is not smaller than 0° and not greater than 7°.

An area ratio between small faces 41a and small faces 41b in growth surface 41 is controlled by varying a concentration of methane gas and impurity gas and a temperature of the substrate. The area ratio between regions 11a and 12a observed in observed surface 10a is thus controlled as shown in FIGS. 4 to 6.

<Comparison with Single-Crystal Diamond Made by Another Manufacturing Method>

A plurality of sectors different in total concentration of an impurity are observed also in a single-crystal diamond obtained by the conventional high-pressure high-temperature synthesis method. For example, a (111) sector is a sector where a (111) face has been grown and a (100) sector is a sector where a (100) face has been grown. The sectors, however, are much larger in size than regions 11a and 12a observed in observed surface 10a. Therefore, in a single-crystal diamond obtained by the high-pressure high-temperature synthesis method, in an observed surface in parallel to the (110) face obtained by polishing a surface, none of first line 15, second line 16, and third line 17 crosses a boundary between the plurality of sectors at least four times.

When a single-crystal diamond layer is epitaxially grown on the (100) face of the seed substrate with CVD, a single-crystal diamond in which the (100) face has been grown is obtained. Therefore, the single-crystal diamond has a uniform concentration of an impurity over the entire observed surface 10a. In other words, regions 11a and 12a different in total concentration of an impurity are not observed in observed surface 10a as in the present embodiment.

When a concentration of methane gas or impurity gas in the growth step is lower than in the present embodiment, even a single-crystal diamond epitaxially grown on the (110) face with CVD does not form a thick single crystal. This is because an orientation necessary for growth in the (110) direction is not obtained, a stable growth surface is not obtained, and a diamond becomes polycrystalline.

Stable characteristics are not obtained with a natural diamond because variation in amount of an impurity is significant.

<First Modification>

Single-crystal diamond 1 in which presence of two types of regions 11a and 12a different in total concentration of an impurity as being mixed over the entire observed surface 10a obtained by polishing of main surface 10 is observed is described above. Presence of two types of regions 11a and 12a different in total concentration of an impurity as being mixed may be observed only in a partial mix area around the center of observed surface 10a.

Figure 12:
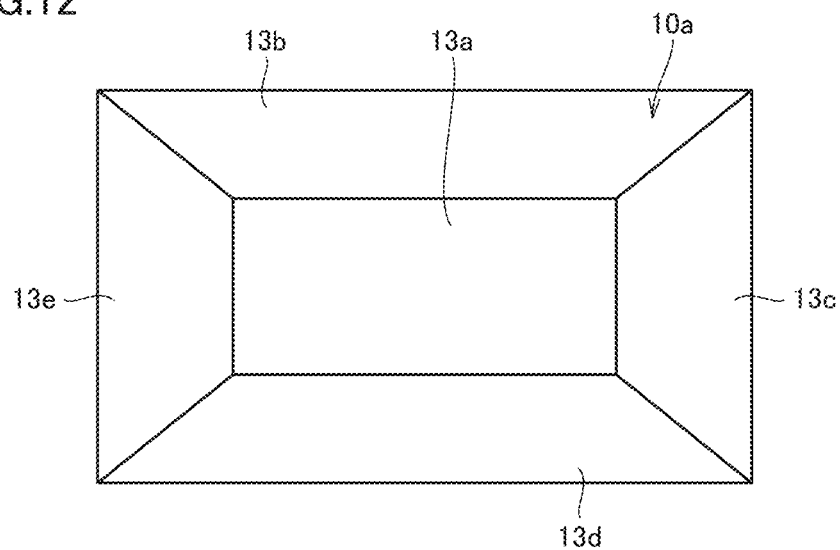
FIG. 12 is a plan view schematically showing the observed surface of a single-crystal diamond according to a first modification of the present embodiment.

FIG. 12 is a plan view schematically showing observed surface 10a in a single-crystal diamond according to the present first modification. As shown in FIG. 12, observed surface 10a is divided into a mix area 13a around the center and uniform areas 13b to 13e located around mix area 13a. In mix area 13a, as shown in FIGS. 2 to 4, presence of two types of regions 11a and 12a different in total concentration of an impurity as being mixed is observed. On the other hand, each of uniform areas 13b to 13e is uniform in impurity concentration. An area of mix area 13a is preferably not lower than 10% of the area of observed surface 10a, and more preferably not lower than 20%, not lower than 30%, not lower than 50%, or not lower than 80% of the area of observed surface 10a. Chipping resistance of single-crystal diamond 1 can thus be improved.

The single-crystal diamond according to the present first modification is obtained by growing a single-crystal diamond layer also on a side surface of seed substrate 30 without covering the side surface of seed substrate 30 with a metal film.

Figure 13:
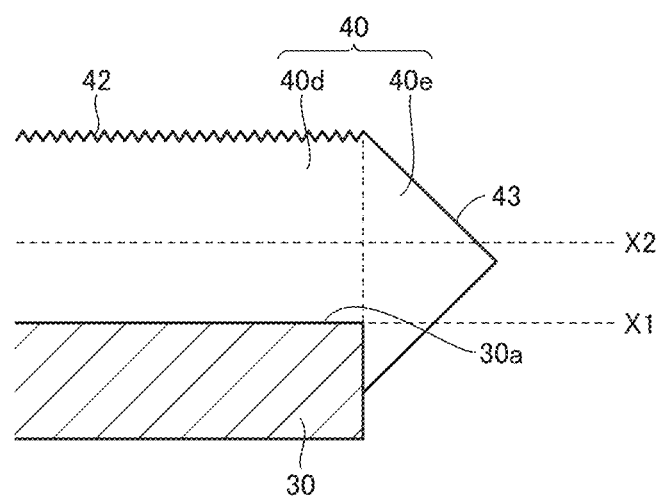
FIG. 13 is a cross-sectional view of a seed substrate and a single-crystal diamond layer when the single-crystal diamond layer is grown without covering a side surface of the seed substrate with a metal film.

FIG. 13 is a cross-sectional view of seed substrate 30 and single-crystal diamond layer 40 when single-crystal diamond layer 40 is grown without covering a side surface of seed substrate 30 with a metal film. A growth surface 42 of single-crystal diamond layer 40 directly on main surface 30a of seed substrate 30 has such a projecting and recessed shape that small (100) faces and small (111) faces inclined with respect to main surface 30a are repeated along the direction in parallel to main surface 30a similarly to growth surface 41 shown in FIG. 11B. Therefore, in an area 40d where growth surface 42 is grown, regions different in total concentration of an impurity are present as being mixed. A growth surface 43 of single-crystal diamond layer 40 other than an area directly on main surface 30a is flat, although it is inclined with respect to main surface 30a. Growth surface 43 is a (100) face or a (111) face. Therefore, an area 40e where growth surface 43 is grown is uniform in concentration of an impurity.

At the main surface of the single-crystal diamond obtained by cutting single-crystal diamond layer 40 along a plane X1 including main surface 30a of seed substrate 30 and a plane X2 between main surface 30a and growth surface 42, area 40d where growth surface 42 has been grown and area 40e where growth surface 43 has been grown are exposed. Therefore, in observed surface 10a obtained by polishing the main surface of the single-crystal diamond, as shown in FIG. 12, mix area 13a where two types of regions different in total concentration of an impurity are present as being mixed and uniform areas 13b to 13e uniform in concentration of the impurity are observed. Mix area 13a corresponds to the surface of area 40d and uniform areas 13b to 13e correspond to the surface of area 40e.

<Second Modification>

The growth step may be divided into two stages of a first stage from start of growth until lapse of a prescribed time period and a second stage following the first stage, and introduction of impurity gas may be restricted in the first stage. For example, in the first stage, single-crystal diamond layer 40 is grown on seed substrate 30 by introducing hydrogen gas and methane gas or introducing hydrogen gas, methane gas, and carbon dioxide gas. A concentration of methane gas with respect to hydrogen gas is desirably set to 1 to 20 mol %. When carbon dioxide gas is introduced, a concentration of carbon dioxide gas with respect to methane gas is desirably set to 1 to 10 mol %.

In the second stage, a single-crystal diamond layer is grown on seed substrate 30 by using hydrogen gas, methane gas, and impurity gas. A concentration of methane gas with respect to hydrogen gas is not lower than 1 mol % and not higher than 20 mol % and a concentration of impurity gas with respect to methane gas is not lower than 1 mol ppm and not higher than 50 mol %.

Figure 14:
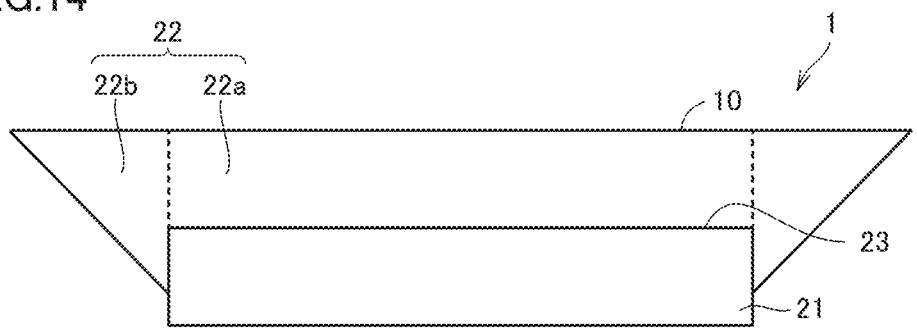
FIG. 14 is a cross-sectional view showing a single-crystal diamond according to a second modification of the present embodiment.

FIG. 14 is a cross-sectional view showing single-crystal diamond 1 according to the present second modification. As shown in FIG. 14, single-crystal diamond 1 includes a first layer 21 having resistivity at room temperature not lower than $10^6$ Ωcm and a second layer 22 having resistivity at room temperature lower than $10^6$ Ωcm. First layer 21 is a single-crystal diamond layer grown in the first stage of the growth step and low in total concentration of an impurity. Therefore, first layer 21 has resistivity not lower than $10^6$ Ωcm. Second layer 22 is a single-crystal diamond layer grown in the second stage of the growth step and has a total concentration of an impurity not lower than 3 mol ppm. Therefore, second layer 22 has resistivity lower than $10^6$ Ωcm. Since second layer 22 contains an impurity, observed surface 10a is obtained by polishing second layer 22. An upper limit value of resistivity of first layer 21 is not particularly limited and the resistivity is not higher than resistivity that a single-crystal diamond free from an impurity can have. Resistivity of second layer 22 is dependent on an amount of impurity contained in second layer 22. Therefore, resistivity of second layer 22 is preferably not lower than 1 Ωcm in consideration of lowering in hardness due to the impurity in second layer 22.

An angle formed between an interface 23 between first layer 21 and second layer 22 and the (110) face is not smaller than 0° and not greater than 7°. Interface 23 has a finely projecting and recessed structure conforming to growth surface 41 shown in FIG. 11B. The finely projecting and recessed structure of interface 23 has an average height not smaller than 1 μm. The average height of the finely projecting and recessed structure is measured in conformity with a mean height Rc under JIS B0601-2001. Interface 23 can be observed in an SEM image, a CL image, or a Raman image of a cross-section of single-crystal diamond 1.

An area 22a in second layer 22 directly on first layer 21 is formed by growth of growth surface 41 as shown in FIG. 11B. Therefore, area 22a falls under a mix area where two types of regions different in total concentration of an impurity are present as being mixed. An area 22b where the (100) face or the (111) face has been grown is formed on a side surface of first layer 21 by growing second layer 22 without covering the side surface of first layer 21 with a metal film. Area 22b falls under a uniform area uniform in concentration of an impurity.

According to the present second modification, first layer 21 having resistivity not lower than $10^6$ Ωcm is in contact with seed substrate 30. Therefore, when conductive layer 30b is formed in seed substrate 30 by implanting carbon ions and first layer 21 and seed substrate 30 are separated from each other by electrolytic etching, electric field is concentrated in conductive layer 30*b*. Time required for the separation step of separating first layer 21 from seed substrate 30 can thus be reduced.

In the present second modification, the separation step may be performed after the first stage and the second stage of the growth step, or the separation step may be performed after the first stage of the growth step and thereafter the second stage of the growth step may be performed.

<Third Modification>

Single-crystal diamond 1 in which two types of regions 11*a* and 12*a* different in total concentration of an impurity are observed in observed surface 10*a* is described above. Three types of regions different in total concentration of an impurity, however, may be observed in observed surface 10*a*. Each of the three types of regions has an area not smaller than 0.1 $\mu m^2$. The total concentration of the impurity in a region highest in impurity concentration is preferably higher by at least 30%, at least 50%, at least 100%, at least 300%, or at least 1000% than the total concentration of the impurity in a region second highest in impurity concentration. The total concentration of the impurity in the region second highest in impurity concentration is preferably higher by at least 30%, at least 50%, at least 100%, at least 300%, or at least 1000% than the total concentration of the impurity in a region lowest in impurity concentration.

By adjusting a type of impurity gas and a concentration of methane gas, growth surface 41 is formed in which third small faces as (113) faces inclined with respect to main surface 30*a* of seed substrate 30 in addition to small faces 41*a* and 41*b* shown in FIG. 11B are repeated along the direction in parallel to main surface 30*a*. Small face 41*a* as the (100) face, small face 41*b* as the (111) face, and the small face as the (113) face are different from one another in amount of impurity taken thereinto. Consequently, three types of regions different in total concentration of the impurity are observed in observed surface 10*a*.

Examples

Though the present disclosure will be described hereinafter in further detail with reference to Examples, the present disclosure is not limited thereto. Single-crystal diamonds of samples Nos. 1 to 10 represent Examples and single-crystal diamonds of samples Nos. 11 to 13 represent Comparative Examples.

<Single-Crystal Diamond of Sample No. 1>

A seed substrate having a main surface angled off relative to the (110) face by 2° which was obtained by the high-pressure high-temperature synthesis method was prepared. The seed substrate had a size of 12 mm×6 mm×2 mm. The main surface of the seed substrate was polished with a grindstone in which diamond abrasive grains having an average grain size from 9 to 35 µm were fixed with a metal, and thereafter washed with an acid (aqua regia) and an organic solvent (ethanol). Thereafter, a conductive layer was formed by implanting carbon ions into the main surface of the seed substrate at energy of 3 MeV.

Then, a single-crystal diamond layer having a thickness of 800 µm was grown on the main surface of the seed substrate by using a microwave plasma CVD apparatus. Hydrogen gas, methane gas, and diborane ($B_2H_6$) as impurity gas were employed as gas for growth. A flow rate of hydrogen gas was set to 500 sccm and a flow rate of methane gas was set to 25 sccm. In other words, a concentration of methane gas with respect to hydrogen gas was set to 5 mol %. A concentration of impurity gas with respect to methane gas was set to 800 mol ppm. A pressure during growth was set to 50 kPa and a temperature during growth (that is, a temperature of the seed substrate) was set to 830° C.

Finally, a single-crystal diamond of sample No. 1 was made by separating the single-crystal diamond layer from the seed substrate by decomposing and removing the conductive layer of the seed substrate by electrolytic etching.

<Single-Crystal Diamond of Sample No. 2>

A single-crystal diamond of sample No. 2 was made under conditions the same as those for sample No. 1 except that a concentration of impurity gas with respect to methane gas was set to 5000 mol ppm and a temperature during growth was set to 800° C.

<Single-Crystal Diamond of Sample No. 3>

A single-crystal diamond of sample No. 3 was made under conditions the same as those for sample No. 1 except that a concentration of methane gas with respect to hydrogen gas was set to 3 mol % (a flow rate of methane gas was set to 15 sccm), a concentration of impurity gas with respect to methane gas was set to 300 mol ppm, a pressure during growth was set to 10 kPa, and a temperature during growth was set to 1110° C.

<Single-Crystal Diamond of Sample No. 4>

A single-crystal diamond of sample No. 4 was made under conditions the same as those for sample No. 1 except that a concentration of methane gas with respect to hydrogen gas was set to 10 mol % (a flow rate of methane gas was set to 50 sccm), a concentration of impurity gas with respect to methane gas was set to 200 mol ppm, a pressure during growth was set to 55 kPa, and a temperature during growth was set to 1200° C.

<Single-Crystal Diamond of Sample No. 5>

A single-crystal diamond of sample No. 5 was made under conditions the same as those for sample No. 1 except that phosphine ($PH_3$) was employed as impurity gas and a concentration of impurity gas with respect to methane gas was set to 10 mol ppm.

<Single-Crystal Diamond of Sample No. 6>

A single-crystal diamond of sample No. 6 was made under conditions the same as those for sample No. 1 except that hydrogen sulfide ($H_2S$) was employed as impurity gas and a concentration of impurity gas with respect to methane gas was set to 10 mol ppm.

<Single-Crystal Diamond of Sample No. 7>

A single-crystal diamond of sample No. 7 was made under conditions the same as those for sample No. 1 except that trimethylaluminum (($CH_3$)$_3$Al) was employed as impurity gas and a concentration of impurity gas with respect to methane gas was set to 50 mol ppm.

<Single-Crystal Diamond of Sample No. 8>

A single-crystal diamond of sample No. 8 was made under conditions the same as those for sample No. 1 except that diborane ($B_2H_6$) and nitrogen ($N_2$) were employed as impurity gas and a concentration of impurity gas with respect to methane gas was set to 1000 mol ppm. A concentration of diborane with respect to methane gas was set to 1000 mol ppm and a concentration of nitrogen with respect to methane gas was set to 20 mol ppm.

<Single-Crystal Diamond of Sample No. 9>

A single-crystal diamond of sample No. 9 was made under conditions the same as those for sample No. 1 except that carbon ions were not implanted into the seed substrate, a concentration of impurity gas with respect to methane gas was set to 2000 mol ppm, a temperature during growth was set to 850° C., and the seed substrate and the single-crystal diamond layer were separated from each other by using laser. Specifically, cutting was performed by irradiating a portion around the interface between the seed substrate and the single-crystal diamond layer with Nd:YAG laser and the cut plane was polished with a grindstone in which diamond abrasive grains having an average grain size from 9 to 35 μm were fixed with a metal.

<Single-Crystal Diamond of Sample No. 10>

A seed substrate having a main surface angled off relative to the (110) face by 2° which was obtained by the high-pressure high-temperature synthesis method was prepared. The seed substrate had a size of 10 mm×5 mm×2 mm. The main surface of the seed substrate was polished with a grindstone in which diamond abrasive grains having an average grain size from 9 to 35 μm were fixed with a metal, and thereafter washed with an acid (aqua regia) and an organic solvent (ethanol). Thereafter, a conductive layer was formed by implanting carbon ions into the main surface of the seed substrate at energy of 3 MeV.

Then, the first layer having a thickness of 300 μm was grown on the main surface of the seed substrate by using a microwave plasma CVD apparatus. Hydrogen gas, methane gas, and carbon dioxide ($CO_2$) gas were employed as gas for growing the first layer. A flow rate of hydrogen gas was set to 500 sccm and a flow rate of methane gas was set to 25 sccm. In other words, a concentration of methane gas with respect to hydrogen gas was set to 5 mol %. A concentration of carbon dioxide gas with respect to methane gas was set to 10 mol %. A pressure during growth of the first layer was set to 12 kPa and a temperature during growth was set to 1200° C.

After the first layer was grown, the first layer was separated from the seed substrate by decomposing and removing the conductive layer of the seed substrate by electrolytic etching. Thereafter, the first layer separated from the seed substrate was washed with an acid (aqua regia) and an organic solvent (ethanol).

Then, the second layer having a thickness of 500 μm was grown on the main surface of the first layer by using the microwave plasma CVD apparatus. Hydrogen gas, methane gas, and diborane ($B_2H_6$) as impurity gas were employed as gas for growing the second layer. A flow rate of hydrogen gas was set to 500 sccm and a flow rate of methane gas was set to 25 sccm. In other words, a concentration of methane gas with respect to hydrogen gas was set to 5 mol %. A concentration of impurity gas with respect to methane gas was set to 6000 mol ppm. A pressure during growth of the second layer was set to 50 kPa and a temperature during growth was set to 850° C. The single-crystal diamond of sample No. 10 constituted of the first layer and the second layer was thus made.

<Single-Crystal Diamond of Sample No. 11>

A single-crystal diamond of sample No. 11 was made under conditions the same as those for sample No. 9 except that a concentration of methane gas with respect to hydrogen gas was set to 5 mol %, a concentration of impurity gas with respect to methane gas was set to 2000 mol ppm, a pressure during growth was set to 50 kPa, and a temperature during growth was set to 730° C.

<Single-Crystal Diamond of Sample No. 12>

A type Ib single-crystal diamond made by the known high-pressure high-temperature synthesis method was employed as a single-crystal diamond of sample No. 12.

<Single-Crystal Diamond of Sample No. 13>

A type IIa single-crystal diamond made by the known high-pressure high-temperature synthesis method was employed as a single-crystal diamond of sample No. 13.

Table 1 below shows a list of conditions for making single-crystal diamonds of samples Nos. 1 to 13.

TABLE 1

| No. | Synthesis Method | Ion Implantation Energy | Impurity Gas | $H_2$ Flow Rate (sccm) | $CH_4$ Flow Rate (sccm) | $CH_4$ Concentration (with respect to $H_2$) (mol %) | Impurity Gas Concentration (with respect to $CH_4$) (mol ppm) | Pressure During Growth (kPa) | Temperature During Growth (° C.) |
|---|---|---|---|---|---|---|---|---|---|
| 1 | CVD | 3 MeV | $B_2H_6$ | 500 | 25 | 5 | 800 | 50 | 830 |
| 2 | CVD | 3 MeV | $B_2H_6$ | 500 | 25 | 5 | 5000 | 50 | 800 |
| 3 | CVD | 3 MeV | $B_2H_6$ | 500 | 15 | 3 | 300 | 10 | 1110 |
| 4 | CVD | 3 MeV | $B_2H_6$ | 500 | 50 | 10 | 200 | 55 | 1200 |
| 5 | CVD | 3 MeV | $PH_3$ | 500 | 25 | 5 | 10 | 50 | 830 |
| 6 | CVD | 3 MeV | $H_2S$ | 500 | 25 | 5 | 10 | 50 | 830 |
| 7 | CVD | 500 keV | $(CH_3)_3Al$ | 500 | 25 | 5 | 50 | 50 | 830 |
| 8 | CVD | 500 keV | $B_2H_6$, $N_2$ | 500 | 25 | 5 | 1000 | 50 | 830 |
| 9 | CVD | None | $B_2H_6$ | 500 | 25 | 5 | 2000 | 50 | 850 |
| 10 | CVD | 3 MeV | $B_2H_6$ | 500 | 25 | 5 | 6000 | 50 | 850 |
| 11 | CVD | None | $B_2H_6$ | 500 | 25 | 5 | 2000 | 50 | 730 |
| 12 | HPHT | — | — | — | — | — | — | — | — |
| 13 | HPHT | — | — | — | — | — | — | — | — |

<Evaluation>

The single-crystal diamonds of samples Nos. 1 to 8 were made through the separation step by electrolytic etching. The single-crystal diamonds of samples Nos. 3 to 7 were lower in concentration of impurity gas used in the growth step than the single-crystal diamonds of samples Nos. 1, 2, and 8. Therefore, the single-crystal diamonds of samples Nos. 3 to 7 were higher in resistivity (electrical resistivity) than the single-crystal diamonds of samples Nos. 1, 2, and 8. Thus, in electrolytic etching in making the single-crystal diamonds of samples Nos. 3 to 7, electric field tends to be concentrated in the conductive layer of the seed substrate. Consequently, time required for the separation step in making the single-crystal diamonds of samples Nos. 3 to 7 was not longer than 40% of time required for the separation step in making the single-crystal diamonds of samples Nos. 1, 2, and 8.

In the single-crystal diamond of sample No. 10, the first layer grown without introducing impurity gas was separated from the seed substrate by electrolytic etching. The first layer had resistivity of $10^7$ Ωcm. Therefore, time required for separating the first layer from the seed substrate by electrolytic etching was further shorter than time required for the separation step in making the single-crystal diamonds of samples Nos. 3 to 7. The second layer of the single-crystal diamond of sample No. 10 had resistivity of 5 Ωcm.

The single-crystal diamonds of samples Nos. 1 to 11 were each made of a single crystal grown on the main surface angled off relative to the (110) face by 2° of the seed substrate. Therefore, by polishing the main surface of each of the single-crystal diamonds of samples Nos. 1 to 11, the observed surface in parallel to the (110) face having surface roughness Ra of 5 μm could readily be exposed. The observed surface of the single-crystal diamond of sample No. 10 was exposed by polishing the surface of the second layer. The observed surface in parallel to the (110) face having surface roughness Ra of 5 μm, of each of the single-crystal diamonds of samples Nos. 12 and 13 were also exposed by polishing the surface thereof.

An SEM image of the observed surface of each of the single-crystal diamonds of samples Nos. 1 to 13 was obtained and observed. Specifically, whether or not two or three types of regions different in total concentration of the impurity were observed in the observed surface was checked. When two or three types of regions different in total concentration of the impurity were observed in the observed surface, a ratio of an area of the mix area where two or three types of regions different in total concentration of the impurity were present as being mixed in the observed surface was determined. Furthermore, a maximum number of times of crossing by each of the first line, the second line, and the third line with the boundary between the two or three types of regions different in total concentration of the impurity in the observed surface was determined.

In the observed surface of each of the single-crystal diamonds of samples Nos. 1 to 13, a concentration of the impurity was measured by nano SIMS. Specifically, when two or three types of regions different in total concentration of the impurity were observed in the observed surface, a total concentration of the impurity in each region was determined. Furthermore, a total average value of an impurity concentration (a total concentration of a single impurity or a plurality of impurities) in each of the single-crystal diamonds of samples Nos. 1 to 13 was calculated.

Table 2 shows a result of measurement for regions different in total concentration of the impurity observed in the observed surface and a result of measurement of the total concentration of the impurity.

surface. Furthermore, each of the first to third lines in the observed surface crossed the boundary between the two types of regions different in total concentration of the impurity at least two hundred times. In the single-crystal diamonds of samples Nos. 1 to 10, the mix area where two types of regions different in total concentration of the impurity were present as being mixed was observed.

In the single-crystal diamonds of samples Nos. 1 and 3 to 9, the mix area occupied the entire observed surface. In contrast, in the single-crystal diamonds of samples Nos. 2 and 10, the mix area occupied 20% of the observed surface.

Though two types of regions different in total concentration of the impurity were observed in the observed surface in the single-crystal diamond of sample No. 11, the maximum number of times of crossing by the first to third lines with the boundary between the two types of regions different in total concentration of the impurity was three. This is because growth was in a (110) orientation due to the low temperature and the concentration of the impurity was uniform.

In the single-crystal diamond of sample No. 12, the concentration of the impurity was uniform in the entire observed surface and a region different in total concentration of the impurity was not observed. Nitrogen was contained as the impurity in the single-crystal diamond of sample No. 12.

In the single-crystal diamond of sample No. 13, a (100) sector and a (111) sector were observed in the observed surface as regions different in total concentration of the impurity. Each of the first to third lines in the observed surface, however, crossed the boundary between the sectors only two times and no mix area where regions different in total concentration of the impurity were present as being mixed was observed. Nitrogen was contained as the impurity in the single-crystal diamond of sample No. 13.

A Knoop hardness of each of the single-crystal diamonds of samples Nos. 1 to 13 was measured in the observed surface with a longer diagonal of a Knoop indentation being in parallel to the <001> direction. A test load in measuring a Knoop hardness was set to 4.9 N.

An X-ray topographic image of each of the single-crystal diamonds of samples Nos. 1 to 13 was obtained and a direction of dislocation was checked. A Raman scattering

TABLE 2

| | | Regions Different in Impurity Concentration | | Area Ratio (High- | Impurity Concentration (mol ppm) | | |
|---|---|---|---|---|---|---|---|
| | | The Maximum Number of Times of Crossing by First to Third Lines with | | Concentration Region:Low- | High- | Low- | |
| No. | Presence | Boundary (Times) | Ratio of Mix Area (%) | Concentration Region) | Concentration Region | Concentration Region | Total Average |
| 1 | Yes | 300 | 100 | 3:2 | 510 | 280 | 420 |
| 2 | Yes | 100 | 20 | 80:1 | 3400 | 2000 | 3300 |
| 3 | Yes | 300 | 100 | 1:1 | 250 | 190 | 220 |
| 4 | Yes | 400 | 100 | 3:2 | 150 | 90 | 120 |
| 5 | Yes | 1000 | 100 | 5:1 | 4.5 | 1.3 | 4.0 |
| 6 | Yes | 200 | 100 | 3:2 | 3.9 | 0.85 | 2.7 |
| 7 | Yes | 300 | 100 | 3:2 | 4.6 | 1.1 | 3.2 |
| 8 | Yes | 100 | 100 | 15:1 | 700 | 350 | 670 |
| 9 | Yes | 400 | 100 | 20:1 | 1700 | 1100 | 1670 |
| 10 | Yes | 100 | 20 | 90:1 | 4500 | 2800 | 4480 |
| 11 | Yes | 3 | 0 | — | 17 | 10 | 14 |
| 12 | No | 0 | 0 | — | — | — | 1 |
| 13 | Yes | 2 | 0 | — | 110 | 30 | 70 |

Figure 15:
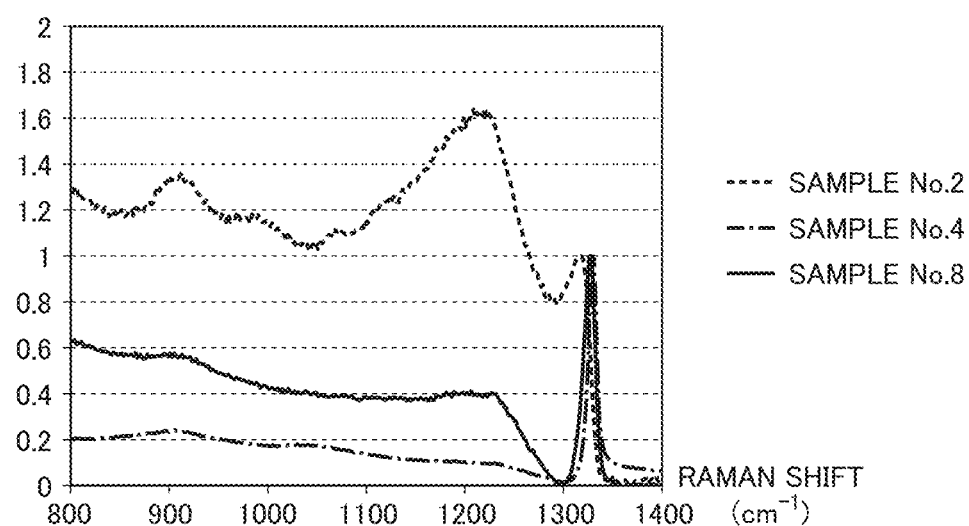
FIG. 15 shows measured Raman scattering spectra of single-crystal diamonds of samples Nos. 2, 4, and 8.

As shown in Table 2, in the single-crystal diamonds of samples Nos. 1 to 10, two types of regions different in total concentration of the impurity were observed in the observed spectrum in excitation at 512 nm, of each of the single-crystal diamonds of samples Nos. 1 to 4, 8 to 10, and 13 for which diborane was employed as impurity gas was determined. The obtained Raman scattering spectrum was subjected to background processing such that background of the peak of a Raman shift from 1310 to 1340 cm$^{-1}$ was zero. In the Raman scattering spectrum subjected to the background processing, a ratio (I1/I2) between absolute intensity I1 of the peak of a Raman shift from 850 to 950 cm$^{-1}$ and absolute intensity I2 of the peak of the Raman shift from 1310 to 1340 cm$^{-1}$ was calculated. FIG. 15 shows measured Raman scattering spectra of the single-crystal diamonds of samples Nos. 2, 4, and 8.

Each of the single-crystal diamonds of samples Nos. 1 to 13 was worked into a shape of a cutter cutting edge and used for cutting of a work material (a workpiece), and chipping resistance was evaluated. RF4080R manufactured by Sumitomo Electric Hardmetal Corporation was employed as a cutter and SNEW1204 ADFR-WS manufactured by Sumitomo Electric Hardmetal Corporation was employed as a wiper insert. NV5000 manufactured by DMG Mori Co., Ltd. was employed as a lathe. Conditions such as a cutting speed of 2000 m/min., a depth of cut of 0.05 mm, and a feed rate of 0.05 mm/edge were set, and chipping in the cutter cutting edge not smaller than 5 µm after cutting by 30 km of workpieces formed of an aluminum material A5052 was counted. A smaller number of chipping counts indicates higher chipping resistance.

Table 3 shows a direction of dislocation, a Knoop hardness, an intensity ratio (I1/I2) of Raman scattering, and a result of chipping count.

TABLE 3

| No. | Direction of Dislocation | Knoop Hardness (GPa) | Intensity Ratio of Raman Scattering (I1/I2*[1]) (%) | Chipping Count (Count) |
| --- | --- | --- | --- | --- |
| 1 | <110> | 92 | 60 | 0 |
| 2 | <110> | 93 | 140 | 0 |
| 3 | <110> | 90 | 30 | 0 |
| 4 | <110> | 96 | 20 | 0 |
| 5 | <110> | 98 | — | 0 |
| 6 | <110> | 96 | — | 0 |
| 7 | <110> | 99 | — | 0 |
| 8 | <110> | 90 | 60 | 0 |
| 9 | <110> | 91 | 90 | 0 |
| 10 | <110> | 89 | 130 | 0 |
| 11 | <110> and <001> | 101 | 20 | 4 |
| 12 | <001> | 94 | — | 5 |
| 13 | <001> | 110 | — | 11 |

*[1] I1 represents absolute intensity of the peak of 850 to 950 cm$^{-1}$ and I2 represents absolute intensity of the peak of 1310 to 1340 cm$^{-1}$.

As shown in Table 3, chipping count of the single-crystal diamonds of samples Nos. 1 to 10 was 0, whereas chipping count of the single-crystal diamonds of samples Nos 11 to 13 was four or more. It can thus be seen that the single-crystal diamonds of samples Nos. 1 to 10 are excellent in chipping resistance.

Though the embodiment and the examples of the present disclosure have been described as above, combination of features in each embodiment and example described above as appropriate or various modification is also originally intended.

It should be understood that the embodiment and the examples disclosed herein are illustrative and non-restrictive in every respect. The scope of the present invention is defined by the terms of the claims rather than the embodiment and the examples above and is intended to include any modifications within the scope and meaning equivalent to the terms of the claims.

REFERENCE SIGNS LIST 1 single-crystal diamond; 10, 30a main surface; 10a observed surface; 10b, 10c cross-section; 10m center of gravity; 11a, 11b, 11c, 12a, 12b, 12c region; 13a, 14a mix area; 13b, 13e uniform area; 14a, 14b, 14c boundary; 15 first line; 16 second line; 17 third line; 21 first layer; 22 second layer; 23 interface; 30 seed substrate; 30b conductive layer, 40 single-crystal diamond layer; 40d, 40e area; 41, 42, 43 growth surface; 41a, 41b small face; N Knoop indentation; n1 diagonal

The invention claimed is:

1. A single-crystal diamond comprising:
   n types of regions different in total concentration of an impurity observed in an observed surface being in parallel to a (110) face and having surface roughness Ra not greater than 5 µm, the observed surface being obtained by polishing a surface of the single-crystal diamond,
   n being 2 or 3,
   each of the n types of regions having an area not smaller than 0.1 µm$^2$,
   at least one of a first line, a second line, and a third line on the observed surface crossing a boundary between the n types of regions at least four times,
   the first line, the second line, and the third line being line segments that are in parallel to a <−110> direction and have a length of 1 mm,
   a midpoint of the first line corresponding to a center of gravity of the observed surface,
   a midpoint of the second line corresponding to a point distant from the center of gravity by 300 µm in a <001> direction,
   a midpoint of the third line corresponding to a point distant from the center of gravity by 300 µm in a <00−1> direction,
   the n types of regions including a first type region and a second type region, the second type region being lower in the total concentration of the impurity than the first type region, and
   a ratio of an area of the second type region to an area of the first type region being 1/20 or more.

2. The single-crystal diamond according to claim 1, wherein
   one of two types of regions selected from the n types of regions is higher in the total concentration of the impurity than the other of the two types of regions by at least 30%.

3. The single-crystal diamond according to claim 1, wherein
   in a cross-section obtained by cutting the single-crystal diamond along a plane including the center of gravity and being in parallel to a (−110) face, the n types of regions different in total concentration of the impurity are observed, and
   an angle formed between the boundary between the n types of regions observed in the cross-section and a <110> direction is not smaller than 0° and not greater than 7°.

4. The single-crystal diamond according to claim 1, wherein
   the impurity includes at least one selected from the group consisting of B, P, Al, and S.

5. The single-crystal diamond according to claim 4, wherein
   the impurity further includes N.

6. The single-crystal diamond according to claim 1, wherein
the total concentration of the impurity contained in the single-crystal diamond is not lower than 3 mol ppm.

7. The single-crystal diamond according to claim 1, comprising a dislocation observed in an X-ray topographic image, wherein
an angle formed between a direction of the dislocation and a <110> direction is not smaller than 0° and not greater than 20°.

8. The single-crystal diamond according to claim 1, having a Knoop hardness not higher than 100 GPa, the Knoop hardness being measured in the observed surface such that a longer diagonal of a Knoop indentation is in parallel to the <001> direction.

9. The single-crystal diamond according to claim 1, wherein
in a Raman scattering spectrum measured by Raman spectroscopy at an excitation wavelength of 512 nm, absolute intensity of a peak of a Raman shift from 850 to 950 cm$^{-1}$ is higher than 10% of absolute intensity of a peak of a Raman shift from 1310 to 1340 cm$^{-1}$.

10. The single-crystal diamond according to claim 1, comprising a first layer having resistivity at room temperature not lower than $10^6$ Ωcm and a second layer having resistivity at room temperature lower than $10^6$ Ωcm, wherein
an angle formed between an interface between the first layer and the second layer and the (110) face is not smaller than 0° and not greater than 7°, and
the observed surface is obtained by polishing the second layer.

11. The single-crystal diamond according to claim 1, wherein
the impurity includes at least one selected from the group consisting of B, P, Al, and S,
the total concentration of the impurity contained in the single-crystal diamond is not lower than 3 mol ppm, and
the single-crystal diamond has a Knoop hardness not higher than 100 GPa, the Knoop hardness being measured in the observed surface such that a longer diagonal of a Knoop indentation is in parallel to the <001> direction.

* * * * *